(12) United States Patent
Logvinov et al.

(10) Patent No.: US 6,917,888 B2
(45) Date of Patent: Jul. 12, 2005

(54) METHOD AND SYSTEM FOR POWER LINE NETWORK FAULT DETECTION AND QUALITY MONITORING

(75) Inventors: Oleg Logvinov, East Brunswick, NJ (US); Lawrence F. Durfee, Washington, NJ (US); Dirk Walvis, Santa Cruz, CA (US)

(73) Assignee: Arkados, Inc., North Plainfield, NJ (US)

( * ) Notice: Subject to any disclaimer, the term of this patent is extended or adjusted under 35 U.S.C. 154(b) by 149 days.

(21) Appl. No.: 10/430,087

(22) Filed: May 6, 2003

(65) Prior Publication Data

US 2004/0036478 A1 Feb. 26, 2004

Related U.S. Application Data

(60) Provisional application No. 60/380,142, filed on May 6, 2002.

(51) Int. Cl.[7] .............................................. G06F 19/00
(52) U.S. Cl. .................................... 702/59; 324/512
(58) Field of Search .............................. 702/59, 61, 62, 702/185; 324/500, 512; 340/870.02; 361/68; 700/286, 291

(56) References Cited

U.S. PATENT DOCUMENTS

| | | | |
|---|---|---|---|
| 5,812,557 A | 9/1998 | Stewart et al. | 371/20.1 |
| 5,986,574 A | 11/1999 | Colton | 340/870.02 |
| 6,014,612 A | 1/2000 | Larson et al. | 702/183 |
| 6,141,634 A | 10/2000 | Flint et al. | 703/18 |
| 6,268,733 B1 * | 7/2001 | Abbata et al. | 324/511 |
| 6,751,562 B1 * | 6/2004 | Blackett et al. | 702/61 |

* cited by examiner

Primary Examiner—Edward Raymond
(74) Attorney, Agent, or Firm—Norris, McLaughlin & Marcus

(57) ABSTRACT

Fault detection and power network quality monitoring are performed for a power line network using power line communications ("PLC") signal transceiving and data processing capabilities. Power line signals are continuously received and processed to obtain signal data representative of power line network operating conditions that are expressed in the received power line signals. The harmonic content and noise signature of the signal data are evaluated with reference to known fault signature data and power line network topology properties for detecting and identifying the location of an existing or anticipated fault in the power line network and assessing power transmission quality of the network.

25 Claims, 4 Drawing Sheets

METHOD AND SYSTEM FOR POWER LINE NETWORK FAULT DETECTION AND QUALITY MONITORING

CROSS REFERENCE TO RELATED APPLICATION

This application claims the benefit of U.S. Provisional Application No. 60/380,142 filed May 6, 2002, which is incorporated by reference herein.

FIELD OF THE INVENTION

This invention relates to the field of data communications over conventional utility electric power conveying media, and more particularly to using power line communications ("PLC") equipment to detect and identify the location of an existing or anticipated fault in an electric power distribution network and to monitor the quality of the power network.

BACKGROUND OF THE INVENTION

A conventional utility electric power generating facility supplies electric power to electric power users over a vast and expansive electric power distribution grid containing many interconnected electric power line networks. The power line networks, which can be of various sizes, convey low, medium or high voltage electric power. Each of the networks includes such power transmission equipment elements as overhead electric power transmission wires, electric power transmission line connectors, surge arrestors and step-down electric power transformers.

Maintenance of the power line networks from which a larger power distribution grid is constructed is a major and ongoing effort. Each of the individual power networks of the grid usually contains a large number of power equipment elements that can conceivably fail in part or completely for a variety of causes, which include exposure to the external environment and end of useful life, to create a partial or complete discontinuity in the network at the element. When a power network element experiences a predetermined failure level, a fault is created in a power line network at the element that prevents satisfactory transmission of electric power downstream of the location of the fault, thereby cutting off the supply of electric power to downstream power users.

Power equipment components can fail either gradually or substantially instantaneously to create a fault in a power line network. A substantially instantaneous fault can be created, for example, upon the complete severing of a connection between a transmission wire and another transmission wire or power wire connector, such as may occur when a utility pole to which a transmission wire is connected falls in a storm. The power company typically learns of this fault from the power user, who no longer is receiving electric power service, soon after the fault initially occurs.

A power company, however, does not usually become aware of a gradual equipment failure, which may eventually become a fault, until the failure becomes so severe that a fault actually occurs. Consequently, the power company does not have the necessary information to perform preventive maintenance on the failing element before the fault occurs. For example, a power transformer, which is known to degrade gradually over time, may begin to operate at less than an optimal level, yet still operate at a level that permits a satisfactory, uninterrupted supply of electric power to downstream power users. In this circumstance, the downstream power users continue to have satisfactory power service while the operating level of the transformer is initially degrading. The power users, therefore, do not notify the power company of any problem with power service. Thus, the power company is not aware of an existing or worsening equipment failure and the potential that the equipment failure can eventually become a fault. Ultimately, an insulation failure in the transformer equipment may develop into a major failure event or fault in the power network. The power company, however, typically learns that the transformer equipment has reached the end of its useful life only after a fault in the network is created.

Therefore, a need exists for method and system for obtaining information concerning operating status of power line network elements and using the element operating status information to detect and identify the location of an existing or anticipated (future) fault in the network.

SUMMARY OF THE INVENTION

In accordance with the present invention, power line communications ("PLC") equipment collects signal data representative of signals continuously received from a power line that is part of a power line network, and performs network monitoring and analysis processing on the signal data to detect and identify the location and the nature of an existing or anticipated fault in the power network and to determine operating status of power line network elements and. In a preferred embodiment, the network monitoring and analysis processing determines that a composite received signal includes predetermined fault characteristics and uses frequency domain or time domain reflectometery techniques to determine and record the signature associated with the network topology and anomaly detection. In an alternative preferred embodiment, the processing analyzes the collected signal data to determine the presence of high frequency components that may be representative of anticipated equipment failures. In a further preferred embodiment, the processing analyzes the collected signal data to determine the presence of harmonics related to power quality monitoring and FCC compliance and also to power factor. In another preferred embodiment, conventional ground current and current and voltage detection circuitry is coupled to the PLC equipment to permit collection of data representative of ground currents and the currents and voltages of signals present on the power line. This ground current and signal current and voltage data also is used in the network monitoring and analysis processing.

In a preferred embodiment, the PLC equipment separates line noises from communication signals by collecting and analyzing PLC silent data representative of electrical signals traveling on the power line network during PLC silent periods, i.e., during predetermined time intervals when PLC data communications and control signals are not scheduled for transmission over the network or are expected not to be transmitted. The PLC silent data can include, as suitable, the polarity, amplitude, phase, and frequency of an electric signal on the power line network and, for an electric signal reflected by an element of the power line network, an electrical signature, such as an impulse response. For example, a PLC silent signal can be a composite of a stimulus signal, which contains a set of specifically spaced sine waves that are useful for extracting frequency domain reflection signature from the power line network, and the reflected stimulus signal, which may additionally contain electrical signatures generated by power line network elements causing the reflection. The PLC silent period signal detection simplifies some network monitoring and analysis processing implementations, where there are a suitable number of silent periods available, by allowing for a straightforward method of monitoring the network response and noise signatures during these periods to look for faults, or phenomena that may lead to faults in the near future, on the network. In cases of heavily loaded networks, where there may not be enough silent periods available for continuous power quality monitoring, a method of extracting a known signal from a composite signal can be used, with the resultant signal being used as a network response signature for the purposes of network monitoring. The PLC silent data can include, as suitable, the polarity, amplitude, phase, and frequency of an electric signal on the power line network and, for an electric signal reflected by an element of the power line network, an electrical signature, such as an impulse response. For example, a PLC silent signal can be a composite of a stimulus signal, which contains a set of specifically spaced sine waves that are useful for extracting frequency domain reflection signature from the power line network, and the reflected stimulus signal, which may additionally contain electrical signatures generated by power line network elements causing the reflection.

In a preferred embodiment, power quality analysis logic ("PQAL") is included with or coupled to the PLC equipment and performs a power quality evaluation by processing the collected PLC silent data or a composite signal data with the extracted background noise to determine the presence of harmonics and power factor distortions. The processing performed by the PQAL includes analyzing the signal data associated with PLC silent intervals or signal (active) intervals whose noise signatures have been extracted with reference to fault signature data representative of power line network fault conditions and expected signal response and signal transfer function associated with the topology of the network. The PQAL, based on the fault evaluation, generates a fault alarm or a warning when an existing or anticipated fault is detected. In an exemplary preferred embodiment for detecting an anticipated fault, an anticipated fault is identified upon detection of the higher frequency harmonics that would be injected onto the power line network when insulation breakdown occurs at a failing transformer. In addition, the PQAL performs further fault evaluation processing to generate fault location data, which identifies the location of the element in the network creating an electric signal discontinuity condition that corresponds to an existing or anticipated fault. In a preferred embodiment, evaluation of historical records containing frequency and time domain response signatures, transfer function parameters, network impedance, and noise signatures helps to determine nature and location of an anticipated or existing fault. In a further embodiment, the PQAL, based on the fault evaluation, generates a power quality estimate that is representative of the power transmission quality of the network.

In a preferred embodiment, the PLC equipment transmits predetermined signals onto the power line to provide that additional signal data can be collected from the power line for use in the network monitoring and analysis processing. In one preferred embodiment, a PLC transceiver, in addition to collecting PLC silent data already existing on the line, generates fault event PLC silent data signals having combinations of predefined transitions and transmits the fault event signals during the PLC silent intervals. The fault event data signals can be PLC or other suitable wideband signals. The PLC transceiver processes reflections of the fault event data signals, which a failing or failed element of the power line network causes and which are received during PLC silent periods, and stores in a memory transmission and received fault event data representative of the transmitted and received fault event data signals, respectively. The PQAL performs a fault evaluation using the received fault event data and, optionally, the transmission fault event data and any other PLC silent data collected at the PLC transceiver.

In another preferred embodiment, a destination PLC transceiver processes a fault event data signal, which was received during a PLC silent period and which a source PLC transceiver transmitted during the PLC silent period, and stores in its memory transfer fault event data representative of the received fault event data signal. The PQAL, at either the source or destination PLC transceiver, uses the transfer and associated transmission fault event data to perform a fault evaluation on the portion of the power line network between the source and destination PLC transceivers. The fault event data is transmitted between the source and destination PLC transceivers, as desired, on PLC data communications signals, based on instructions that the PLC transceiver performing the fault evaluation transmits to the other PLC transceiver on PLC data communications signals.

In a further preferred embodiment, a plurality of PLC transceivers is on the power line network and each of the PLC transceivers transmits to a PLC head end unit, over the power line network and on PLC data communications signals, PLC silent data that includes fault event data. The PLC head unit, which contains conventional PLC transceiver equipment, uses the PLC silent data to perform a high level network fault evaluation. In still another preferred embodiment, each of the PLC transceivers transmits to the PLC head end unit the fault alarm, fault location and power network quality estimate data results of the fault evaluations performed at the respective PLC transceivers.

In a further preferred embodiment, the PQAL in the PLC transceiver controls and causes transmission of time domain reflectometry ("TDR") data signals onto the power line network during the PLC silent periods. The PLC transceiver stores TDR data representative of reflected TDR data signals received at the PLC transceiver during the PLC silent periods. The PQAL uses the TDR data, together with any other available PLC silent data, in a fault evaluation to more precisely identify the location of an existing or anticipated fault.

In a further preferred embodiment, the PQAL in the PLC transceiver controls and causes transmission of frequency domain reflectometry ("FDR") data signals onto the power line network during the PLC silent periods. The PLC transceiver stores FDR data representative of reflected FDR data signals received at the PLC transceiver during the PLC silent periods. The PQAL uses the FDR data, together with any other available PLC silent data, in a fault evaluation to more precisely identify the location of an existing or anticipated fault.

In still another preferred embodiment, the PQAL performs a fault evaluation using PLC silent data and channel quality data which is stored at the PLC transceiver and was collected based on monitoring of PLC signals during the PLC active period.

BRIEF DESCRIPTION OF THE DRAWINGS

Other objects and advantages of the present invention will be apparent from the following detailed description of the presently preferred embodiments, which description should be considered in conjunction with the accompanying drawings in which.

DETAILED DESCRIPTION OF THE INVENTION

The use of electrical signals traveling on a power line communications ("PLC") network to perform power line network fault evaluation and quality monitoring is illustrated below in connection with a conventional, prior art PLC transceiver which further includes power quality analysis logic ("PQAL") in accordance with the present invention. The addition of the PQAL to the conventional PLC transceiver is substantially a software modification requiring relatively few hardware changes and readily permits collection of data representative of power line signals on the network, during both PLC active and PLC silent intervals, for use in a power line network fault evaluation. The conventional PLC transceiver provides for a physical and electronic signal connection to the power line network, which includes the functionalities of generating and injecting wideband signals onto the power line network and receiving and processing power line signals. For the purpose of explaining the preferred embodiment, it is assumed that the PLC transceiver uses a signal above about 60 Hz and below about 100 MHz, and has the capability to transmit and receive signals in the frequency band spanning from 0 Hz (DC) to about 300 Mhz. It is to be understood that, in accordance with the present inventive technique, the PQAL can be included within or coupled to any device having power line network signal transmitting and receiving capabilities and associated data signal processing and storage capabilities. It is to be further understood that, for purposes of illustration, the PQAL is shown as a separate block and also that the PQAL could be implemented as a plurality of functions embedded in other existing modules of a system in accordance with the present invention and/or a plurality of extensions to the existing modules of the system or a combination thereof.

Figure 1:
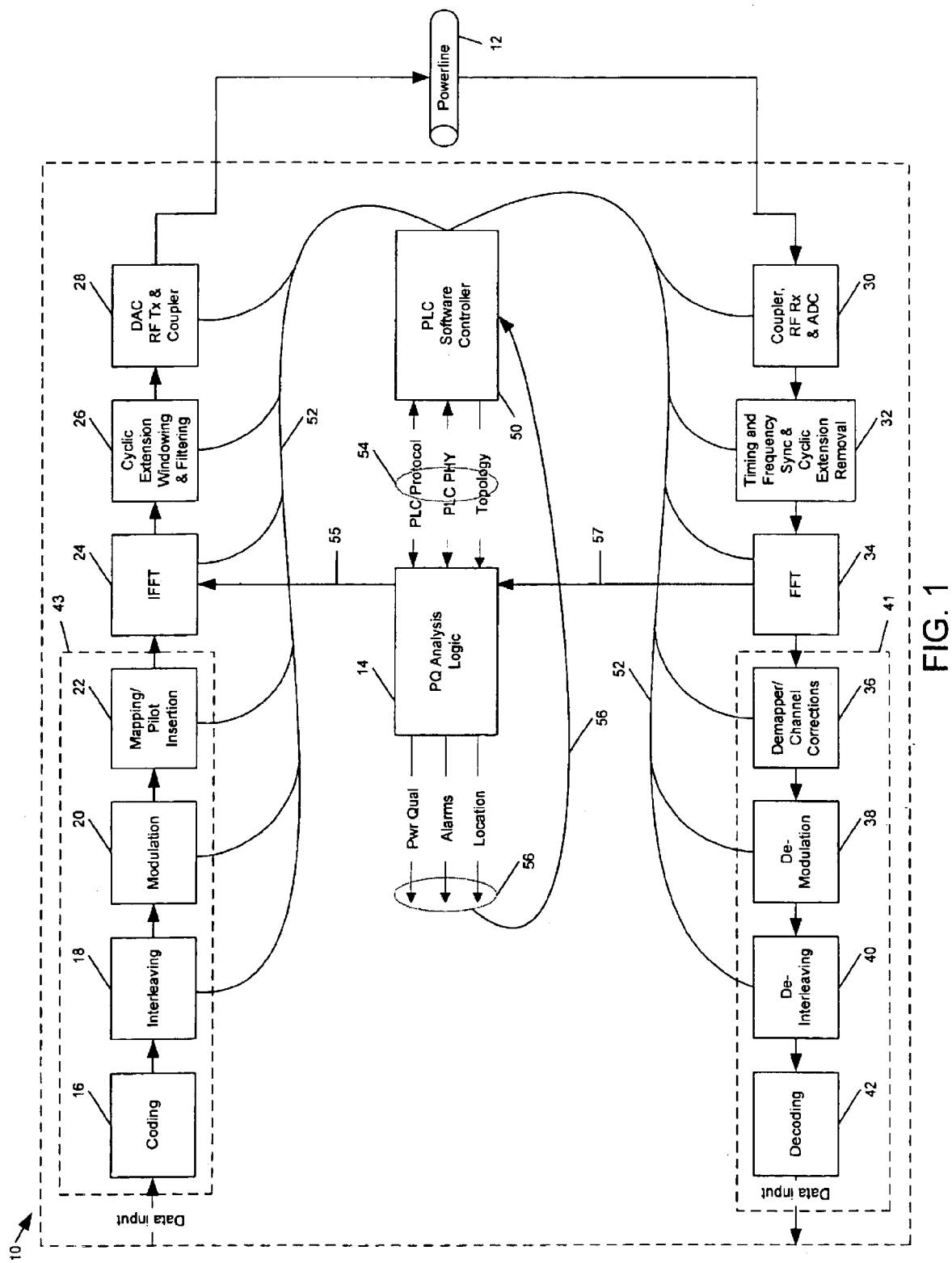
FIG. 1 is a block diagram of a preferred embodiment of a power line communication transceiver including power quality analysis logic in accordance with the present invention.

FIG. 1 shows a preferred embodiment of a conventional orthogonal frequency division multiplexing ("OFDM") PLC transceiver 10 coupled to a power line network element 12 and further including PQAL 14 in accordance with the present invention. See, for example, U.S. patent application Ser. No. 10/211,033, filed Aug. 2, 2002 and U.S. application Ser. No. 10/309,567, filed Dec. 4, 2002, each of which is assigned to the assignee of this application and incorporated by reference herein, for a description of conventional PLC transceiver construction and operation. The inventive PLC transceiver is shown in FIG. 1 and described below as containing, in addition to the PQAL 14, conventional functional PLC transceiver blocks for processing PLC and other power line signals. The PLC transceiver blocks generate, and transmit and receive, power line signals, such as conventional PLC control and data communications signals. In addition, the PLC transceiver blocks perform power line signal processing, including conventional PLC signal processing, and store and process power line signal data that the PQAL can use in fault evaluation processing. It is to be understood that the PLC transceiver blocks of the inventive PLC transceiver described below as performing data or signal processing operations constitute a software module, a hardware module or a combined hardware/software module. In addition, each of the modules suitably contains a memory storage area, such as RAM, for storage of data and instructions for performing processing operations in accordance with the present invention. Alternatively, instructions for performing processing operations can be stored in hardware in one or more of the modules. Similarly, the PQAL 14 can constitute a software module, a hardware module or a combined hardware/software module.

Referring to FIG. 1, the PLC transceiver blocks establish the physical connection and electronic signal link between the power line network element 12 and a data input/output ("I/O") device, such as a computer, as is known in the prior art. The following PLC transceiver blocks are connected to one another in sequence and operate (i) to connect the PLC transceiver to the I/O device that provides input data, and (ii) to generate and transmit onto the power line network a PLC signal containing the input data: coding 16, interleaving 18, modulation 20, mapping/pilot insertion 22, inverse fast fourier transform ("iFFT") 24, cyclic extension windowing and filtering 26 and digital-to-analog converter ("DAC"), radio frequency ("RF") transmitter and power line coupler 28. The PLC transceiver blocks 36, 38, 40 and 42, in combination, constitute PLC receiver logic 41.

Further, the following PLC transceiver blocks are connected in sequence and operate (i) to receive a PLC data signal from the power line network, and (ii) to extract the digital data that is carried on the received PLC signal: power line coupler, RF receiver and analog-to-digital converter ("ADC") 30, timing and frequency synchronization and cyclic extension removal 32, FFT 34, demapper/channel correction 36, demodulation 38, deinterleaving 40 and decoding 42. The PLC transceiver blocks 16, 18, 20 and 22, in combination, constitute PLC transmitter logic 43. As is known well known in the art, the PLC transceiver blocks 28 and 30 are connected to the power line network element 12 and convert digital data to power line signals and vice versa, respectively. Also as is well known in the art, the PLC transceiver blocks 24 and 34 process digital data transmitted on and received from the power line network between the time domain and the frequency domain.

In addition, the PLC transceiver 10 includes a conventional PLC software controller 50 and a data and control signal bus 52. The bus 52 couples the controller 50 to each of the PLC transceiver blocks 16, 19, 20, 22, 24, 26, 28, 30, 32, 34, 36, 38, 40 and 42. As is known in the prior art, the controller 50 transmits control signals to, and exchanges data signals with, each of the PLC transceiver blocks 16, 18, 20, 22, 24, 26, 28, 30, 32, 34, 36, 38, 40 and 42 to establish a signal link between the power line network element 12 and an I/O device, which is coupled to the PLC transceiver blocks 16 and 42.

Referring to FIG. 1, in accordance with a preferred embodiment of the present invention, the PQAL 14 is coupled to the iFFT 24 and the FFT 34 by data lines 55 and 57, respectively, and to the PLC controller 50 by input data line 54 and fault evaluation data output line 56. The PQAL 14 includes a memory (not shown) for storing power line network information and protocol information, which the controller 50 supplies on the line 54. The power line network information preferably includes power line network topology data representative of the expected signal response of the power line network that extends upstream and downstream from the element 12. In addition, the PQAL 14 memory includes protocol data, such as PLC protocol layer and PHY layer data, which provides information as to the PLC active and silent periods. The PLC active and silent period information permits the PQAL 14 to control the reception and transmission of power line signals and also reflections of signals generated at the PLC transceiver, which are discussed in detail below, at the PLC transceiver blocks 24, 26, 28, 30, 32 and 34, such that signal data representative of received PLC active and silent signals can be obtained for use in fault evaluation processing in accordance with the present invention.

In a preferred embodiment, the memory of the PQAL 14 includes data representative of unique, identifiable signal signatures which can be used to determine that the power line network includes an existing or anticipated fault. The identifiable signatures correspond to those signals that would be generated and transmitted over a power line network when an element in a power transmission system, such as a transformer, surge arrestor or overhead wire, begins to fail. For example, the signature data can include the unique RF signature representative of the corona like discharge imposed on the power line network when a tree branch touches an overhead power transmission wire.

In a preferred embodiment, an external source transmits the network topology data to the PLC transceiver 12 on a PLC data communications signal and the controller 50 forwards this network topology data to the PQAL 14 on the line 54.

The PLC transceiver 10 operates as follows in accordance with a preferred embodiment of the invention. The PLC transceiver blocks 30, 32 and 34 process power line signals, or composite signals, which are received at the power line element 12 during the PLC silent and active periods. In this embodiment, the power line signals may not be a function of or based on a power line signal transmitted by a PLC transceiver which is on the power line network to which the element 12 is coupled. The FFT block 34 generates digital PLC silent data or composite signal data representative of the received signals and forwards the signal data to the PQAL 14. The PLC silent data preferably includes the polarity, amplitude, phase and frequency of the received power line signal and also its electrical signature. The composite signal data preferably includes the extracted noise signatures of the network. The PQAL 14 stores in its memory the signal data received from the FFT block 34.

In accordance with the present invention, the PQAL 14 processes the signal data in view of the network topology and fault signature data, which was provided from the controller 50 and stored in its memory, to determine whether the signal data indicates an existing or anticipated fault and which element or elements in the network constitute the discontinuity causing the fault condition. In a preferred embodiment, the processing of the signal data with respect to the stored signatures in the PQAL memory can provide information about the distance between the PLC transceiver and the power line network element that caused the RF signature which is represented in the signal data. In a preferred embodiment, if the PQAL determines that the signal data includes a unique stored signature, important parameters about the event that caused the fault, such as the presence of harmonics or power factor distortions, would be known. Based on the results of the fault evaluation processing, the PQAL 14 generates a fault alarm indicating an existing or anticipated fault.

Once a fault is detected, the PQAL 14 performs further processing on the signal data to determine the location and characteristics of the power network element or elements causing the fault, and generates fault location data based on this processing. In a preferred embodiment, the PQAL 14 evaluates the signal data in view of the network topology and a detailed list of element properties to identify the network element or elements causing the fault. Depending on the network complexity, the PQAL performs additional fault evaluation processing, with reference to the signature data, to identify or locate the element.

In an alternative preferred embodiment, the PLC transceiver 10 generates signal data from the power line signals received during each successive PLC silent period, and the PQAL 14 creates a history of power line network signal characteristics based on the stored historical PLC silent data for use in the fault evaluation processing.

In a preferred embodiment where a suitable number of PLC silent periods are available for collecting PLC silent data, the detection of PLC silent signals simplifies network monitoring and analysis processing performed by the PQAL 14 by permitting direct monitoring of the network response signature during the PLC silent periods for determining the presence of faults or phenomena that may lead to faults in the near future on the network. In embodiments where the network is heavily loaded, such that an insufficient number of PLC silent periods is available for continuous power quality monitoring, network monitoring by the PQAL is preferably performed by determining if a composite signal, detected during PLC active periods, includes a known response signature.

In a further preferred embodiment, the PQAL 14, as part of the fault evaluation processing, determines the quality of the power line and generates power line quality estimate data.

Figure 2:
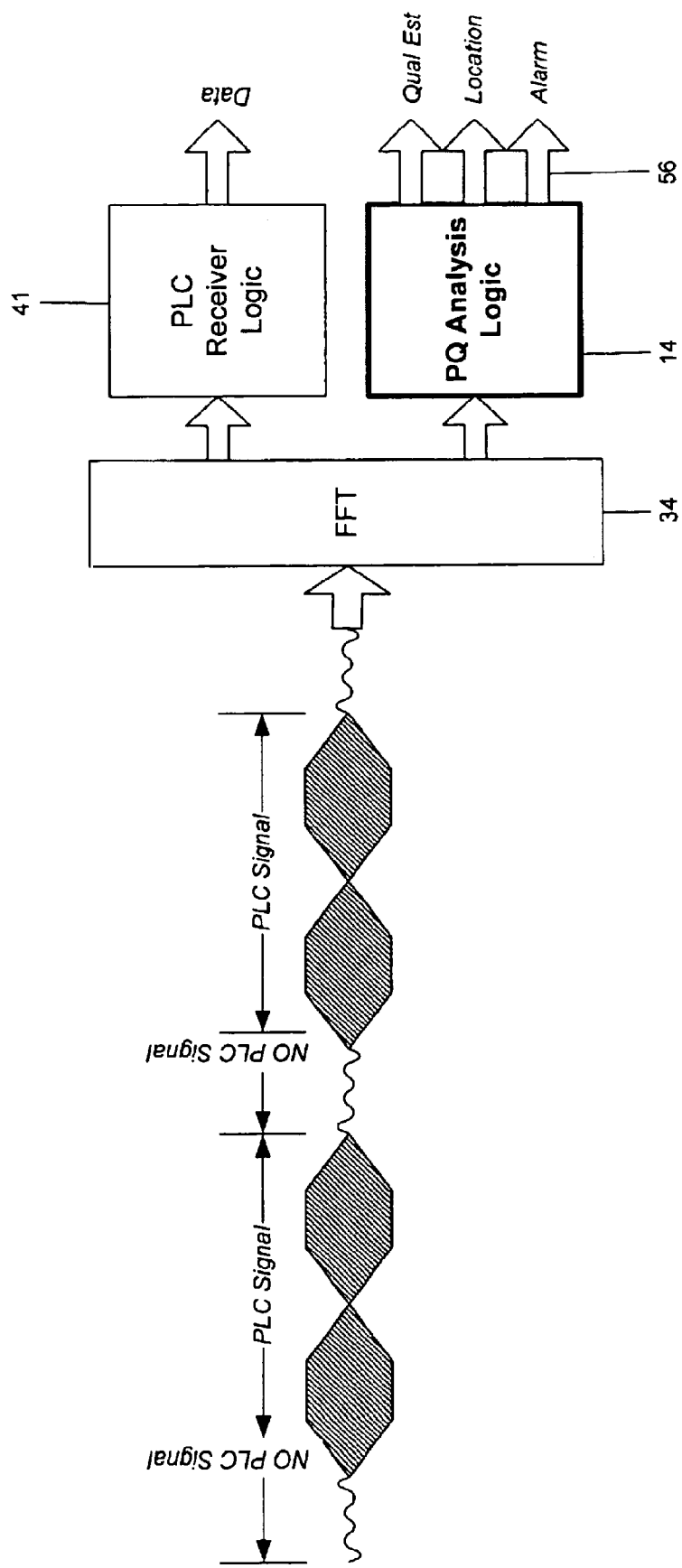
FIG. 2 is a time domain representation of power line signal transmission during the PLC active and silent periods and illustrates the results of PQAL processing at a PLC transceiver in accordance with the present invention.

It is noted that PLC transceiver operation during the PLC active periods continues as in the prior art. The PLC transceiver blocks 30, 32, 34 receive PLC data communication signals and the PLC receiver logic 41 generates a digital data output based on the received signals. Further, the PLC transmitter logic 43 provides input data to the PLC transceiver blocks 24, 26 and 28, which generate and transmit PLC data communication signals. FIG. 2 illustrates typical power line signal transmission during the PLC silent and active periods and the data outputs generated at the PLC transceiver 10 based on the fault evaluation processing and also conventional PLC data communications signal processing. In a preferred embodiment, the PQAL 14 also uses channel history quality data collected at the PLC transceiver 10 during the PLC active interval, such as described in U.S. patent application Ser. No. 09/605,064, U.S. patent application Ser. No. 09/290,353, and U.S. Provisional Patent Application No. 60/113,608, filed Dec. 23, 1998, each of which is assigned to the assignee of this application and incorporated by reference herein, in the fault evaluation processing to detect and locate faults.

Following fault evaluation processing, the PQAL 14 transmits fault alarm, fault location and power quality estimate data to the controller 50 on the line 56. The controller 50 then causes the transmission of this fault evaluation data to a desired destination, such as the I/O device connected to the PLC transceiver block 42.

In a preferred embodiment, the controller 50 causes transmission of the fault evaluation data onto the power line network on PLC data communication signals, such that a user having signal communications access or an indirect communications link to the power line network can receive the data. Consequently, higher level network control elements can readily receive and use the fault evaluation data to further analyze and identify the power line network conditions.

Figure 3:
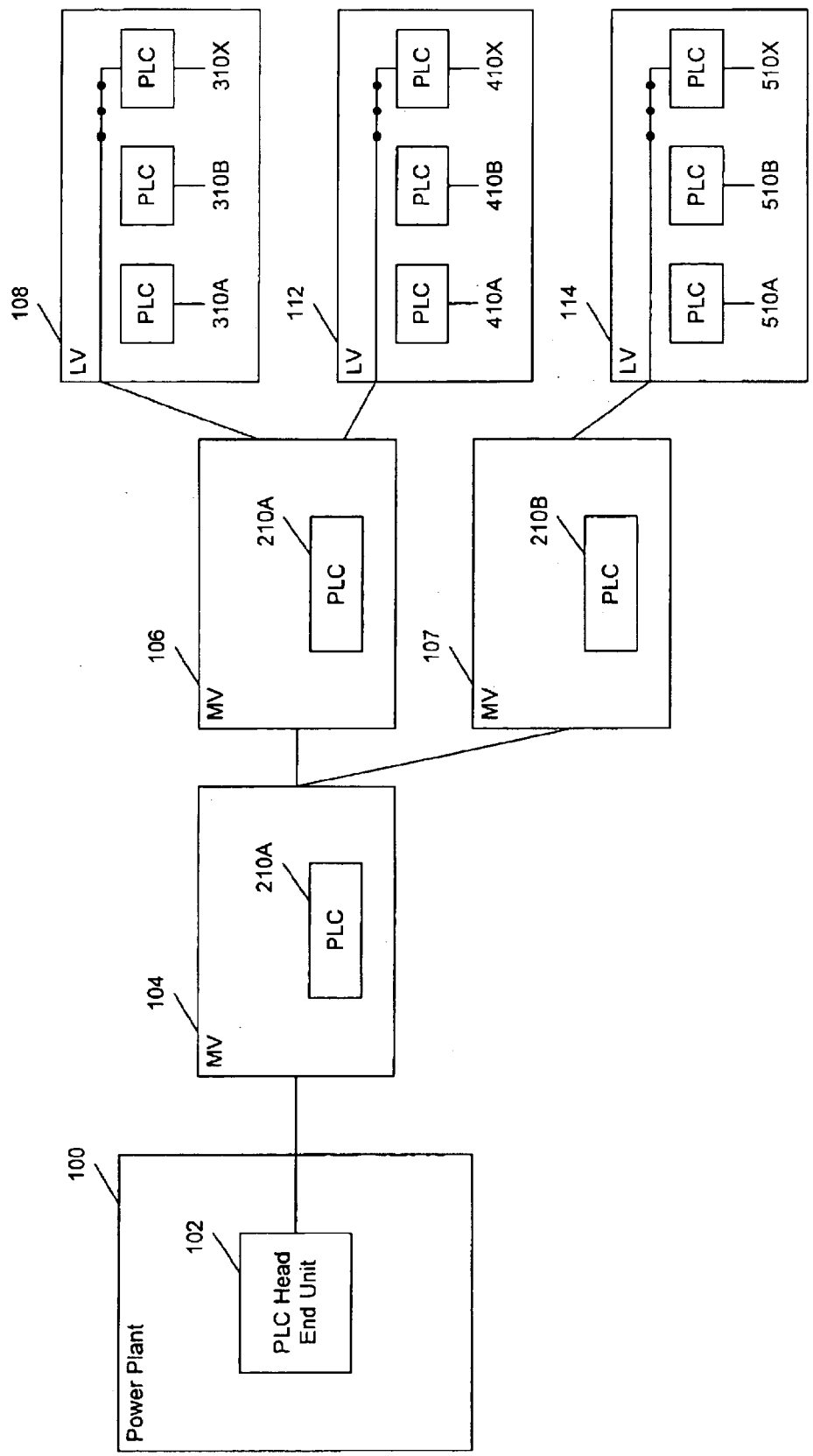
FIG. 3 is a block diagram of a preferred embodiment of a power line network distribution system including a PLC head end unit and high, medium and low voltage power line networks including PLC transceivers containing respective PQALs in accordance with the present invention.

FIG. 3 illustrates a preferred embodiment of a power line network 90 including a power plant 100 containing a PLC head end unit 102, a high voltage power network 104 containing a PLC transceiver 110, medium voltage power networks 106 and 107 containing respective PLC transceivers 210A and 210B, and low voltage power networks 108, 112 and 114 containing respective PLC transceivers 310A, 310B, . . . 310X, 410A, 410B, . . . 410X and 510A, 510B, . . . 510X. Each of the PLC transceivers in the networks 104, 106, 107, 108, 112 and 114 is preferably identical, or substantially similar, in construction and operation as the PLC transceiver 10 described above. The PLC head end unit 102 is a conventional device which has been modified to include software associated with the evaluation of a power line network for faults and power quality conditions based on fault evaluation data generated at the PQAL of a PLC transceiver, as described above. In a preferred embodiment, each of the PLC transceivers in the networks 104, 106, 107, 108, 112 and 114 continuously transmits to the PLC head end unit 102 PLC silent data, alarm data, fault location data and power quality estimate on PLC data communications signals. The PLC head end unit 102 uses such data to perform higher level network processing concerning faults and power quality.

Thus, the present invention advantageously provides that the presence of a plurality of the networked PLC nodes in a given network can be used in connection with single-ended and multi-node techniques and methods of measurement and network analysis. In a single-ended mode a stimulus signal originates at the point of measurement, whereas in a multi-mode mode a stimulus signal originates in the node not co-located with a node conducting the measurements. In this configuration, the networked environment offers the ability to coordinate multi-mode measurements as well as perform system calibration and synchronization functions.

Referring again to FIGS. 1–2, in a preferred embodiment, the PQAL 14 causes the PLC transceiver 12 to transmit fault event data signals onto the power line network during the PLC silent periods. The fault event data signals transmissions generate additional PLC silent data for use in fault evaluation processing. The PQAL 14 uses the PLC protocol layer and PHY layer data to coordinate access to the power line network, such that fault event data signals are transmitted onto the power line network only during the PLC silent periods. In this preferred mode of operation, based on fault event data provided by the PQAL 14, the PLC transceiver blocks 24, 26 and 28 generate and transmit onto the power line network at the element 12 fault event data signals. The PQAL 14 stores in its memory transmit fault event data, representative of the transmitted fault event data signals, and reflection fault event data, representative of reflections of the fault event data signals received during the PLC silent periods and then processed at the PLC transceiver blocks 30, 32 and 34. Preferably, the PQAL 14 performs fault evaluation using the transmit and received fault event data.

Figure 4:
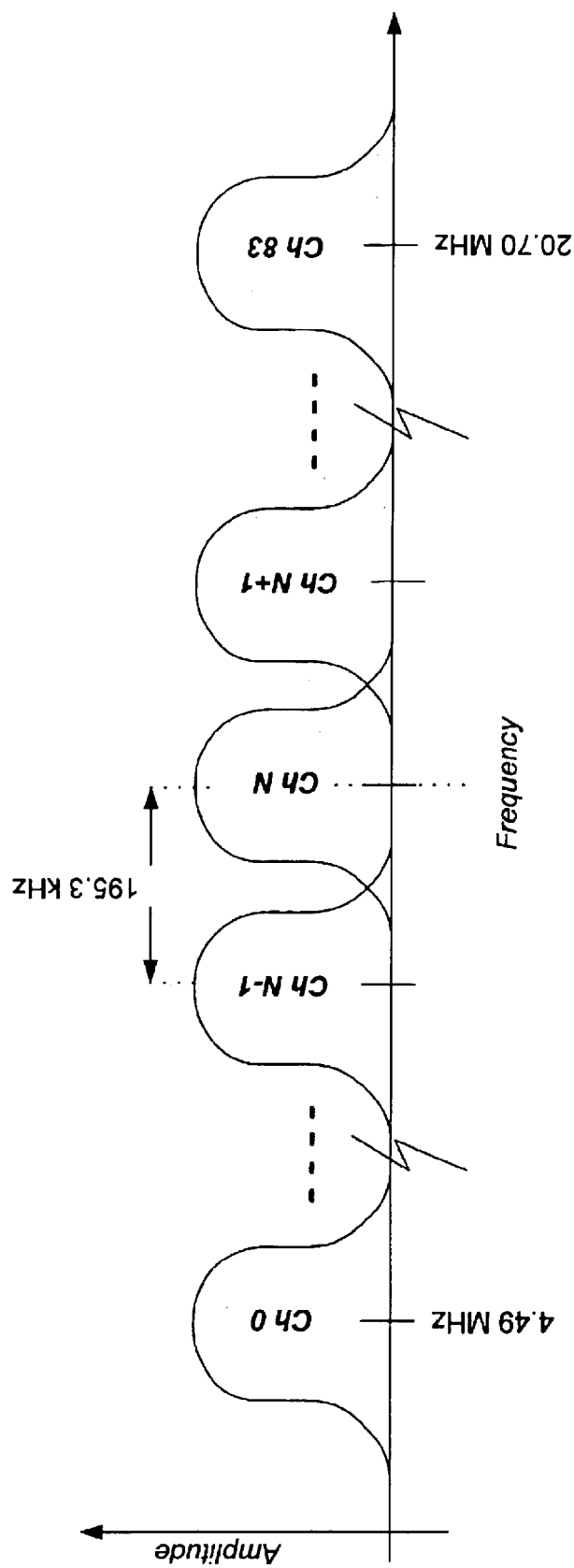
FIG. 4 is a time domain representation of a preferred embodiment of a time domain reflectometery power line signal transmitted during the PLC silent interval in accordance with the present invention.

In a further preferred embodiment, the PQAL 14 causes the PLC transceiver 12 to generate wideband time domain reflectometry ("TDR") signals as the fault event data signals, to transmit these TDR signals onto the power line network at the element 12 during the PLC silent periods, and to receive during the PLC silent periods reflected TDR signals at the PLC transceiver blocks 30, 32 and 34. The TDR signal is preferably a wideband signal because it approaches an ideal impulse signal and, therefore, permits easier signal processing for identification of a fault. In one preferred embodiment, the PQAL 14 generates a wideband OFDM TDR signal, such as shown in FIG. 4, for transmission onto the power line network. The PQAL 14 stores in its memory TDR data representative of the reflected TDR signals which are received and processed at the PLC transceiver blocks 30, 32 and 34. In addition, the PQAL 14 memory preferably includes TDR signature data which is representative of the presence of a shorted connection, open connection, resistive connection, etc., in the power line network.

In a preferred embodiment, the PQAL 14 uses the TDR data in a fault evaluation to determine characteristics of the power line network under analysis, such as the nature of each discontinuity, and to help detect network faults or anticipated faults. In a further alternative embodiment, the PQAL 14 uses the TDR data to identify a change in the characteristics of a network to prompt further analysis. The PQAL preferably uses the TDR data to determine, with greater resolution, the distance of a discontinuity from the PLC transceiver along a power line network path.

In alternative preferred embodiment, the PQAL 14 causes the PLC transceiver 12 to generate frequency domain reflectometry ("FDR") signals as the fault event data signals and performs processing similar to that described above with respect to the TDR signals to identify a change in the characteristics of a network and determine, with greater resolution, the distance of a discontinuity from the PLC transceiver along a power line network path. In addition, the memory of the PQAL 14 would include an initial signature of the FDR response data which can be used to continuously compare with current response data and identify changes that would be the result of a change occurring in the network or a network device. Further, the FDR data can be used in a fault evaluation algorithm to more precisely identify the location of an existing or anticipated fault. See U.S. Pat. No. 6,466,649, incorporated by reference herein.

In a further preferred embodiment, the PQAL uses a combination of PLC silent period data and composite FDR data to further pinpoint the fault location or network anomaly.

In another preferred embodiment, the PQAL 14 provides that a shaped pulse like signal is generated and used to provide a time domain response of the network. In another embodiment, a sweep like signal could be used to measure transfer function and S parameters of the network.

Thus, the inventive PLC transceiver generates a steady output stream of power line network quality information, fault alarms and fault location data based on processing of power line signals with respect to fault signature, power line network topology and expected power line network signal response information. The PLC transceiver can be operated to generate TDR or FDR data, which can be used to more precisely determine the location of the element or elements detected as causing the existing or anticipated fault.

Although preferred embodiments of the present invention have been described and illustrated, it will be apparent to those skilled in the art that various modifications may be made without departing from the principles of the invention.

What is claimed is:

1. A method for detecting a fault in an electric power distribution network comprising continuously receiving, at a power line communications ("PLC") receiver, electric power line signals from the power network; processing the received power line signals to obtain signal data representative of physical characteristics of the received power line signals; and performing fault evaluation processing using the signal data and at least one of predetermined fault signature, high frequency, signal harmonics and network topology data to determine whether the signal data corresponds to an existing or anticipated fault in the power network; transmitting onto the network, from a PLC transmitter during PLC silent periods, transmission fault event data signals; processing reflection of the transmission fault event data signals received at the PLC receiver during the PLC silent periods to obtain received fault event data; and wherein the fault evaluation processing further uses the received fault event data.

2. The method of claim 1, wherein the transmission fault event data signals include at least one of time and frequency domain reflectometry signals.

3. The method of claim 1, wherein the signal data includes at least one of frequency, amplitude, phase, polarity and electrical signature of the received power line signals.

4. The method of claim 1, wherein the fault evaluation processing generates location data corresponding to the location of the detected fault in the power network.

5. The method of claim 1, wherein the fault evaluation processing generates location data corresponding to the location of the detected fault in the power network.

6. The method of claim 5, wherein the fault evaluation processing uses the received TDR data to identify the location of the detected fault in the power network.

7. The method of claim 5, wherein the transmission TDR signals are wideband signals.

8. The method of claim 1, wherein the fault evaluation processing generates power network quality data.

9. The method of claim 1 further comprising:
collecting power network channel quality data at the PLC receiver during PLC active periods; and
wherein the fault evaluation processing further uses the channel quality data.

10. The method of claim 1 further comprising:
transmitting the signal data, on the power network using PLC data signals, to a PLC head end unit, wherein the PLC head end unit performs further processing on the signal data to detect an existing or anticipated fault, identify the location of a detected fault and provide a power network quality estimate.

11. The method of claim 1 further comprising:
transmitting, on the power network using PLC data signals, to a PLC head end unit fault evaluation data results from the fault evaluation processing, wherein the fault evaluation data results identify a network element determined to be a cause of a detected fault, location of the network element causing the fault and power line quality estimate data.

12. The method of claim 1 further comprising:
transmitting signals for use in the fault evaluation processing and performing the fault evaluation processing at a PLC transceiver.

13. The method of claim 12 wherein the fault evaluation processing includes at least one of fault anticipation, fault detection, fault analysis, and fault location.

14. The method of claim 1 wherein the fault evaluation processing utilizes signal data obtained from power line signals received at a single PLC node.

15. The method of claim 1 wherein the fault evaluation processing utilizes signal data obtained from power line signals received at a plurality of nodes.

16. The method of claim 15 further comprising:
communicating the signal data and data resulting from the fault evaluation processing at the plurality of the nodes to a selected node on the power network, wherein the selected node performs fault evaluation processing including network testing, fault location, fault anticipation, power quality measurements, and fault analysis.

17. The method of claim 1 further comprising:
storing historical data related to network signatures and parameters.

18. The method of claim 17, wherein the fault evaluation processing used the stored historical data to detect faults and anticipate events such as faults.

19. The method of claim 18, wherein the fault evaluation processing has an ability to learn network behavior and typical signatures and parameters.

20. The method of claim 19, wherein the fault evaluation processing includes process modeling functionalities that allow for a development of self-learning models capable of predicting system response and behavior based on the historical data.

21. The method of claim 15 further comprising:
performing centralized fault evaluation processing at one of the nodes.

22. The method of claim 15 further comprising:
performing the fault evaluation processing at at least two of the nodes.

23. The method of claim 15 wherein the fault evaluation processing is performed by a separate entity having means of direct or indirect communication with all of the nodes.

24. The method of claim 15, wherein one of the nodes performs functions of a data aggregation and a proxy for the other nodes.

25. The method of claim 15, wherein at least two of the nodes perform functions of a data aggregation and a proxy for the other nodes creating a multi-tiered system.

* * * * *